(12) United States Patent  
Hailey et al.

(10) Patent No.: US 6,252,161 B1
(45) Date of Patent: Jun. 26, 2001

(54) EMI SHIELDING VENTILATION STRUCTURE

(75) Inventors: Jeffrey C. Hailey, Austin; Richard N. Worley, Cedar Park, both of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/444,068

(22) Filed: Nov. 22, 1999

(51) Int. Cl.⁷ ..................................................... H05K 9/00
(52) U.S. Cl. .......................... 174/35 R; 361/688; 361/818
(58) Field of Search ......................... 174/35 R; 331/81 B; 361/688, 818

(56) References Cited

U.S. PATENT DOCUMENTS

| | | | |
|---|---|---|---|
| 5,030,793 | * 7/1991 | McCarthy | 174/35 R |
| 5,638,259 | * 6/1997 | McCarthy et al. | 174/35 R |
| 5,928,076 | 7/1999 | Clements et al. | 454/184 |
| 6,018,125 | * 1/2000 | Collins et al. | 174/35 R |

* cited by examiner

Primary Examiner—Shawn Riley
(74) Attorney, Agent, or Firm—Skjerven Morrill MacPherson, LLP

(57) ABSTRACT

A data processing system including but not limited to an enclosure of the data processing system having a waveguide-below-cutoff EMI-attenuating air ventilation structure formed from a dielectric-conductor combination material, the enclosure of the data processing system containing at least one data processing system component selected from the group including but not limited to a processor, a memory, a bridge, a bus, a graphics processor, a network card, an isochronous device. A related method for manufacturing a waveguide-below-cutoff EMI-attenuating air ventilation structure including but not limited to forming at least one aperture structured to attenuate at least one specified electromagnetic energy waveform within a dielectric-conductor combination material.

23 Claims, 5 Drawing Sheets

Extruded or Molded Vent with Circular Apertures

Extruded or Molded Vent with Circular Apertures

Extruded or Molded Vent with Arbitrary Geometric Apertures

Extruded or Molded Vent with Honeycomb Structure

EMI SHIELDING VENTILATION STRUCTURE

BACKGROUND

1. Technical Field

This patent application relates, in general, to suppressing electromagnetic radiation in and around data processing systems.

2. Description of the Related Art

Data processing system components (e.g., personal computer system components such as integrated circuits) are typically mounted on or integrated within printed circuit boards. During operation of a data processing system having one or more printed circuit boards, the data processing system components cause electric currents to be generated on or in the printed circuit boards and on or in the associated data processing system components. Such electric currents often result in electromagnetic energy being radiated.

Electromagnetic radiation can interfere with data processing system operation (in which case the electromagnetic radiation is referred to as electromagnetic interference (EMI)). Accordingly, efforts are made within the art to shield printed circuit boards and/or their associated data processing system components from electromagnetic radiation. Conventionally, such shielding is accomplished via sheet metal structures used to enclose all or part of the printed circuit board and data processing system components utilized in data processing systems. These sheet metal shielding structures block electromagnetic energy and thereby serve two functions: (1) they shield printed circuit boards and/or data processing system components external to the shielding structures from electromagnetic radiation emanating from printed circuit boards and/or data processing system components internal to the sheet metal shielding structures, and (2) they shield printed circuit boards and/or data processing system components internal to the sheet metal shielding structures from electromagnetic radiation emanating from sources external to the sheet metal shielding structures.

The ideal situation is to have completely sealed sheet shielding structures, which provide virtually total electromagnetic radiation shielding. Unfortunately, this is generally not practicable in current data processing system environments, because most modern data processing system components require active air, water, or other cooling. For example, modern microprocessors generate great amounts of heat energy, and are only rated to function accurately up to a specified case (a plastic or ceramic shell enclosing the microprocessor) temperature, and without active cooling, it is likely that the microprocessors will function incorrectly or fail. Accordingly, it is generally not practicable to enclose a microprocessor, or any other data processing system component, in a completely sealed sheet metal shielding structure since such a sealed sheet metal shielding structure traps heat.

As a compromise, current practice is to use a perforated structure (e.g., a sheet metal structure with holes) which allows some air flow through the structure (via the perforations, or holes) and which also provides some electromagnetic shielding (via the presence of the sheet metal conductor). Historically, designs of such perforated structures have typically been derived by a trial and error process involving (1) formation of a perforated sheet metal structure, (2) employment of the perforated sheet metal structure within a data processing system, (3) measurement of heat dissipation and emitted radiation characteristics of the so-employed structure, and (4) successive modification of the structure in response to such measurements until a structure having acceptable characteristics was obtained.

More recent designs of sheet metal structures have utilized less of a trial and error approach. For example, at least one recent design has advocated using two layers of slotted metallic conductive material, with the slots of the first layer oriented transverse to the slots of the second layer material. The teaching is that the material, so arranged, will block both vertically and horizontally polarized electromagnetic waveforms while allowing ventilation. While this design works well in theory, in practice it has proved sub-optimum. As another example, at least one other recent shielding design has advocated utilizing sheet metal structures in which one or more waveguide below cutoff structures are resident. A waveguide is a hollow structure, formed from a low resistivity conductive material (typically metal), which only allows electromagnetic energy waveforms above a certain frequency (known in the art as the "cutoff frequency") to propagate through the hollow portion of the waveguide. Because the waveguide is a hollow structure, air can transit the structure, thereby providing cooling in a fashion analogous to the perforated shielding discussed above. In the waveguide below cutoff scheme, the waveguide is fabricated such that it functions efficiently as a waveguide only above a cutoff frequency, where the cutoff frequency is sufficiently above the frequency of the electromagnetic energy waveforms likely to be generated by printed circuit boards or other data processing system components.

SUMMARY

The inventors named herein have discovered a system and method which give several advantages over the waveguide below cutoff scheme as taught in the prior art. Advantages of the system and method are described in more detail in the detailed description, below.

In one embodiment, the system includes but is not limited to an enclosure of the data processing system having a waveguide-below-cutoff EMI-attenuating air ventilation structure formed from a dielectric-conductor combination material, the enclosure of the data processing system containing at least one data processing system component selected from the group including but not limited to a processor, a memory, a bridge, a bus, a graphics processor, a network card, an isochronous device. In one embodiment, a related method for manufacturing a waveguide-below-cutoff EMI-attenuating air ventilation structure includes but not limited to forming at least one aperture structured to attenuate at least one specified electromagnetic energy waveform within a dielectric-conductor combination material.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of this patent application will become apparent in the non-limiting detailed description set forth below.

BRIEF DESCRIPTION OF THE DRAWING

The use of the same reference symbols in different drawings indicates similar or identical items.

DETAILED DESCRIPTION

As mentioned above, recent designs in the art have advocated using waveguides below cutoff to provide shielding to data processing system components. With respect to conventional waveguides, the objective generally is to guide electromagnetic waveforms through the waveguides with as little loss of electromagnetic energy as possible. Consequently, the teaching is generally that waveguides should be constructed from a highly conductive material, and generally the more conductive the better (e.g., "Most waveguides are made of either aluminum, brass, or copper. In order to reduce ohmic losses, some waveguides have their internal surfaces electroplated with either gold or silver, both of which have lower resistivities than the other metals mentioned above." J. Carr, *Microwave Waveguides and Antennas*, Chapter 18 of Practical Antenna Handbook, page 348 (2ed. 1994)). The reason for using highly conductive materials in waveguides is to ensure that electromagnetic waveforms having frequencies at or slightly above cutoff, traverse the waveguide in substantially unattenuated form.

Figure 1A:
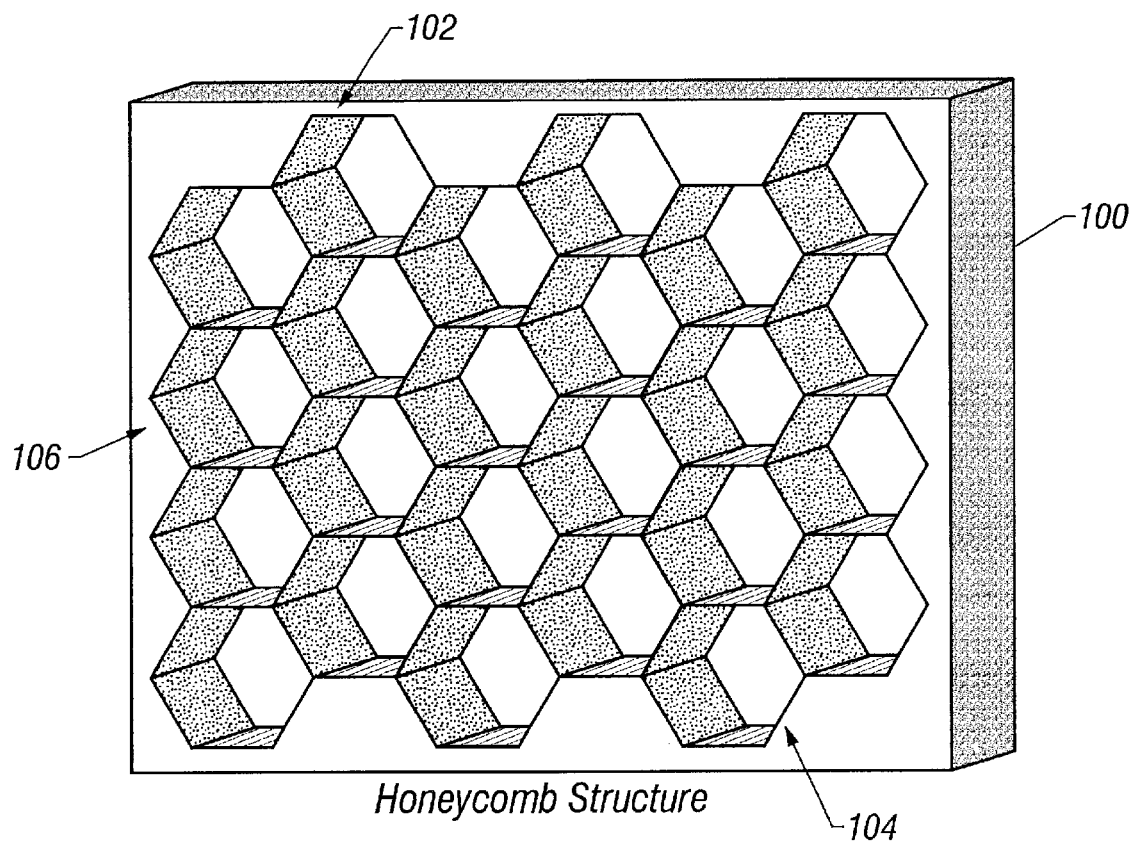
FIGS. 1A and 1B depict a perspective view of related-art sheet metal EMI-attenuating air ventilation structure 100, which is sometimes utilized in data processing systems, and a perspective view of how sheet metal EMI-attenuating air ventilation structure 100 is typically formed in the related art.
Figure 1B:
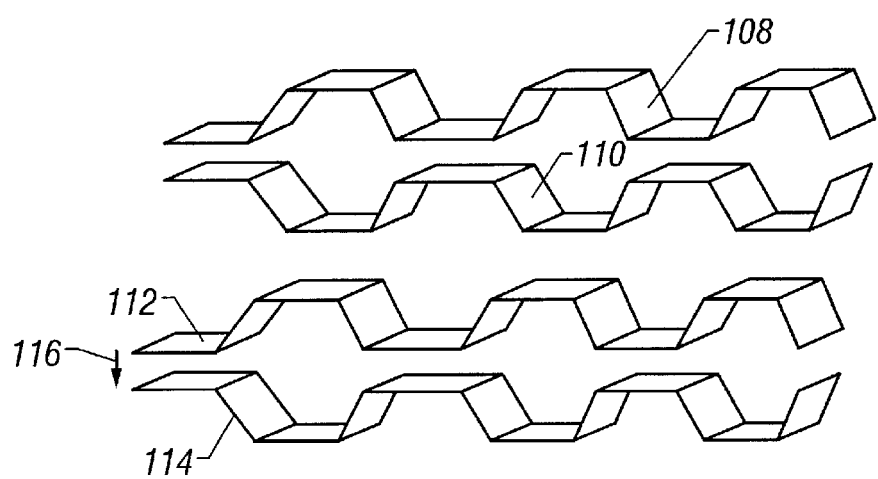

With reference to the figures, and in particular with reference now to FIG. 1A, depicted is a perspective view of related-art sheet metal EMI-attenuating air ventilation structure 100 which is sometimes utilized in data processing systems. Shown is sheet metal EMI-attenuating air ventilation structure 100 formed such that several honeycomb-structure apertures, such as honeycomb-structure apertures 102, 104, 106, appear within sheet metal EMI-attenuating air ventilation structure 100. Further illustrated in FIG. 1B is a perspective view showing that related-art sheet metal EMI-attenuating air ventilation structures such as sheet metal EMI-attenuating air ventilation structure 100, are typically formed by stamping strips of sheet metal, such as stamped sheet metal strips 108, 110, 112, 114, such that each stamped sheet metal strip constitutes ½ of a complete honeycomb-structure aperture. Thereafter, the individual previously-stamped sheet metal strips are brought together such that honeycomb-structure apertures are formed. For example, one row of honeycomb-structure apertures can be formed by bringing stamped sheet metal strip 112 together with stamped sheet metal strip 114, which can be accomplished by moving stamped sheet metal strip 112 in vertical direction 116 a holding stamped sheet metal strip 114 stationery. Thereafter, another row of honeycomb-structure apertures can be formed in like fashion by bringing stamped sheet metal strip 110 together with the structure formed by stamped sheet metal strip 114 and stamped sheet metal strip 112. Thereafter again, yet another row of honeycomb-structure apertures can be formed in again like fashion by bringing stamped sheet metal strip 108 together with the structure formed by stamped sheet metal strips 114, 112, and 110. The foregoing process may be repeated until the desired number of honeycomb-structure apertures has been formed, at which point a border portion (not shown) of sheet metal is stamped such that it may be fitted around the formed honeycomb-structure apertures such that related art sheet metal EMI-attenuating air ventilation structure 100 having honeycomb-structure apertures is produced.

As has been noted, in the related art the teaching has focused on utilizing conductors, and particularly metallic conductors, to construct EMI-attenuating air ventilation structures, with the teaching generally being that the less resistive the conductor utilized the better. Consequently, the art has focused on constructing EMI-attenuating air ventilation structures from metallic conductors.

In contradistinction to this teaching within the waveguide art, it has been discovered that forming a waveguide structure from a dielectric-conductor combination material—which as used herein refers to a conductive elastomeric, or conductor-impregnated plastic, such as plastic impregnated with carbon fibers or conductive (e.g., silver) beads—actually provides superior performance when the waveguide structure is employed to simultaneously provide electromagnetic energy shielding and cooling of data processing system components. This discovery goes against the teaching of the related art in that utilizing dielectric-conductor combination materials in place of metallic conductors to construct the EMI-attenuating air ventilation structures actually results in a much poorer "waveguide."

The teaching in the art of waveguides is to provide for a very low resistance surface made of conducting metal in order to provide good waveguide characteristics even at or near the cutoff frequency of the waveguide. However, insofar as the "waveguide" structure is being utilized herein to attenuate electromagnetic energy waveforms below a certain cutoff frequency, the fact that a poorer waveguide structure is produced actually improves the functioning of the EMI-attenuating air ventilation structures. That is, as has been discussed, when a waveguide structure is employed to provide electromagnetic shielding, the focus is in the opposite direction of that normally of concern in the waveguide art: rather than being concerned that frequencies at or above cutoff transit the waveguide in unattenuated form, herein a user wants to be assured that radiation below, and even at or above cutoff will be severely attenuated when transiting the waveguide. By building the waveguide structure from dielectric-conductor combination material, it is possible to actually attenuate or block frequencies higher than the cutoff frequency of a similar shaped metal waveguide. The greater resistivity and permittivity combination of the dielectric-conductor combination material waveguide can serve to attenuate electromagnetic waveforms at or above cutoff frequency. This gives the advantage of providing electromagnetic shielding up to a given frequency but with larger holes than would be possible with metallic waveguides, which allows increased cooling capacity over the prior art with respect to any given cutoff frequency.

In addition to the foregoing advantage, those skilled in the art will appreciate that waveguide below cutoff structures formed from metal in actuality do radiate some energy even at frequencies below cutoff. It has been discovered that by building the waveguide structure from dielectric-conductor combination material, it is possible to provide more attenuation of frequencies at or below the cutoff frequency than is possible with a similar-shaped metallic waveguide below cutoff air ventilation structure. Those skilled in the art will appreciate that this is also a substantial advantage in that it will give a greater attenuation over a metallic waveguide structure with similar geometry.

In addition to the foregoing noted advantages related to electromagnetic energy attenuation and air ventilation, additional manufacturing advantages may be obtained due to the fact that dielectric-conductor combination materials can typically be formulated from plastic materials (e.g., an elastomeric dielectric-conductor combination material, or a plastic dielectric-conductor combination material) which can be injection molded and/or relatively easily cut to form apertures having shapes of widely varying geometries. Constructing EMI-attenuating air ventilation structures from metallic conductors has several disadvantages. One disadvantage is that the machine tools (e.g., stamping or extruding machines) utilized to construct EMI-attenuating air ventilation structures from metallic conductors typically have a substantially limited life due to the fact that they are working upon and/or with metals. Another disadvantage is that, due to the physical limitations associated with stamping and/or extruding metals, the shapes of the structures which may be formed are relatively limited. Yet another disadvantage is that EMI-attenuating air ventilation structures constructed from metallic conductors tend to be relatively heavy.

Several advantages are associated with molding the waveguide-based data processing system shielding structures rather than stamping or extruding. For example, molding gives greater freedom in forming a variety of waveguide structures over and above that available in the prior art. Other manufacturing advantages may be obtained due to the fact that the typically lower specific hardnesses and lower melting points of such dielectric-conductor combination materials, as compared to metallic conductors, can often give rise to longer tool lives. In addition, the lower specific hardnesses of the dielectric-conductor combination materials can allow the shapes to be relatively easily cut, or "punched," from the dielectric materials.

Figure 2:
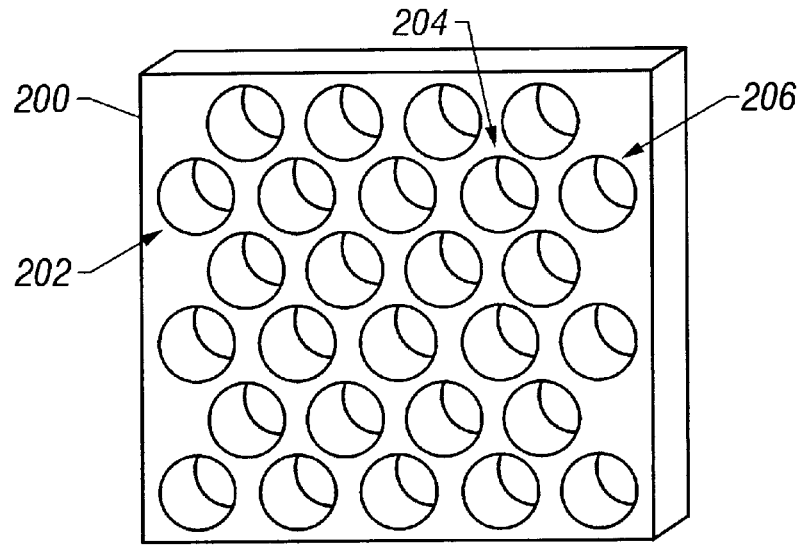
FIG. 2 illustrates a perspective view of dielectric-conductor combination material waveguide-below-cutoff EMI-attenuating air ventilation structure 200.

Referring now to FIG. 2, illustrated is a perspective view of dielectric-conductor combination material waveguide-below-cutoff EMI-attenuating air ventilation structure 200. Shown is dielectric-conductor combination material waveguide-below-cutoff EMI-attenuating air ventilation structure 200 formed to have a number of circular-structure apertures, such as circular-structure apertures 202, 204, and 206. As noted in FIG. 2, dielectric-conductor combination material waveguide-below-cutoff EMI-attenuating air ventilation structure 200 can be formed by extruding or molding. In addition, given the relatively low specific hardnesses of most dielectric-conductor combination materials, it is also possible to form dielectric-conductor combination material waveguide-below-cutoff EMI-attenuating air ventilation structure 200 by "punching," or "cutting," the circular-structure apertures from a piece of dielectric-conductor combination material from which dielectric-conductor combination material waveguide-below-cutoff EMI-attenuating air ventilation structure 200 is to be formed. The forgoing is especially true when the dielectric-conductor combination material is conductor-impregnated plastic, such as carbon-impregnated plastic.

Determination of what size apertures to use with the dielectric-conductor combination material waveguide-below-cutoff EMI-attenuating air ventilation structure 200 in order to achieve certain desired EMI attenuation characteristics can be made via the use of the following described empirical process.

First, the generalized equation:

$$\text{Cutoff Frequency in Hertz} = 6.9*10^9/D$$

where D is the largest dimension (i.e., diameter) of the circular-structure aperture cross section, in inches, and Cutoff Frequency is given in Hertz is used to select an initial value for D. (This equation is taken from H. Ott, *Noise Reduction Techniques in Electronic Systems* 192 (2d ed. 1988)). Using this equation, one selects the cutoff frequency of interest and works backwards to get D. Thereafter, one constructs a dielectric-conductor combination material waveguide-below-cutoff EMI-attenuating air ventilation structure 200, having circular-structure apertures whose largest cross section (i.e., diameter) is D, positions and places the structure proximate to an electromagnetic energy radiating source (e.g., the positioning of the structure proximate to data processing system components, such as described in relation to FIGS. 5 and 7, below).

Subsequent to placement of the structure near the electromagnetic energy radiating source, the electromagnetic waveform energy at a given frequency (typically at or near cutoff) at a given distance from the dielectric-conductor combination material waveguide-below-cutoff EMI-attenuating air ventilation structure 200 is measured. Thereafter, the D values (i.e., size) of the apertures (e.g., circular-structure apertures 202, 204, and 206) are incrementally enlarged, and the electromagnetic waveform energy at the given frequency and distance from dielectric-conductor combination material waveguide-below-cutoff EMI-attenuating air ventilation structure 200 is again measured. If the measured radiation characteristics at the given frequency and distance are still within tolerance, the circular-structure apertures are again enlarged and the measurement of the radiated energy is repeated. This process (enlargement of the apertures and measurement of the radiated energy) is repeated until the measured radiated energy exceeds design tolerance (which will vary with application on a case by case basis depending on the application). When the design tolerance is exceeded, it is known that the size of the circular-structure apertures (e.g., circular-structure apertures 202, 204, and 206) which existed just before the very last incremental enlargement (which took the measurement out of tolerance) is a size which will give a substantially optimum tradeoff between EMI attenuation and air ventilation for dielectric-conductor combination material waveguide-below-cutoff EMI-attenuating air ventilation structure 200. Those skilled in the art will recognize that this empirical approach is in accord with that normally taken in the EMI art.

Figure 3:
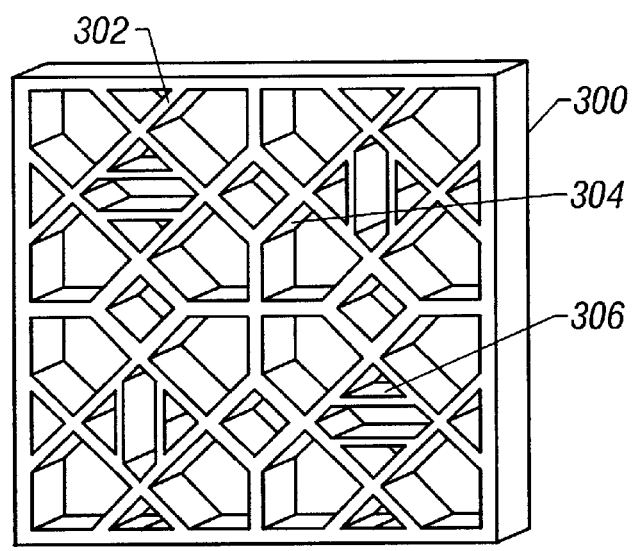
FIG. 3 shows a perspective view of dielectric-conductor combination material waveguide-below-cutoff EMI-attenuating air ventilation structure 300.

With reference now to FIG. 3, illustrated is a perspective view of dielectric-conductor combination material waveguide-below-cutoff EMI-attenuating air ventilation structure 300. Shown is dielectric-conductor combination material waveguide-below-cutoff EMI-attenuating air ventilation structure 300 formed to have a number of varying-structure apertures, such as varying-structure apertures 302, 304, and 306. As used herein, "varying-structure apertures"

means virtually any arbitrary shaped apertures which are empirically determined to attenuate at least one specified frequency electromagnetic waveform by a specified amount at some given distance from a dielectric-conductor combination material waveguide-below-cutoff EMI-attenuating air ventilation structure formed to have the varying-structure apertures. As noted in FIG. 3, dielectric-conductor combination material waveguide-below-cutoff EMI-attenuating air ventilation structure 300 can be formed by extruding or molding. In addition, given the relatively low specific hardnesses of most dielectric-conductor combination materials, it is also possible to form dielectric-conductor combination material waveguide-below-cutoff EMI-attenuating air ventilation structure 300 by "punching," or "cutting," the varying-structure apertures from a piece of dielectric-conductor combination material from which dielectric-conductor combination material waveguide-below-cutoff EMI-attenuating air ventilation structure 300 is to be formed. The forgoing is especially true when the dielectric-conductor combination material is conductor-impregnated plastic, such as carbon-impregnated plastic.

Determination of what size apertures to use with the dielectric-conductor combination material waveguide-below-cutoff EMI-attenuating air ventilation structure 300 in order to achieve certain desired EMI attenuation characteristics can be made via the use of the following described empirical process.

First, the generalized equation:

$$\text{Cutoff Frequency in Hertz} = 5.9 \times 10^9 / L$$

where L is the largest dimension of the varying-structure aperture cross section, in inches, and Cutoff Frequency is given in Hertz is used to select an initial value for L. (This equation is taken from H. Ott, *Noise Reduction Techniques in Electronic Systems* 192 (2d ed. 1988)). Using this equation, one selects the cutoff frequency of interest and works backwards to get L. Thereafter, one constructs a dielectric-conductor combination material waveguide-below-cutoff EMI-attenuating air ventilation structure 300, having varying-structure apertures whose largest cross section is L, positions and places the structure proximate to an electromagnetic energy radiating source (e.g., the positioning of the structure proximate to data processing system components, such as described in relation to FIGS. 5 and 7, below).

Subsequent to placement of the structure near the electromagnetic energy radiating source, the electromagnetic waveform energy at a given frequency (typically at or near cutoff) at a given distance from the dielectric-conductor combination material waveguide-below-cutoff EMI-attenuating air ventilation structure 300 is measured. Thereafter, the L values (i.e., size) of the apertures (e.g., varying-structure apertures 302, 304, and 306) are incrementally enlarged, and the electromagnetic waveform energy at the given frequency and distance from dielectric-conductor combination material waveguide-below-cutoff EMI-attenuating air ventilation structure 300 is again measured. If the measured radiation characteristics at the given frequency and distance are still within tolerance, the varying-structure apertures are again enlarged and the measurement of the radiated energy is repeated. This process (enlargement of the apertures and measurement of the radiated energy) is repeated until the measured radiated energy exceeds design tolerance (which will vary with application on a case by case basis depending on the application). When the design tolerance is exceeded, it is known that the size of the varying-structure apertures (e.g., varying-structure apertures 302, 304, and 306) which existed just before the very last incremental enlargement (which took the measurement out of tolerance) is a size which will give a substantially optimum tradeoff between EMI attenuation and air ventilation for dielectric-conductor combination material waveguide-below-cutoff EMI-attenuating air ventilation structure 300. Those skilled in the art will recognize that this empirical approach is in accord with that normally taken in the EMI art.

Figure 4:
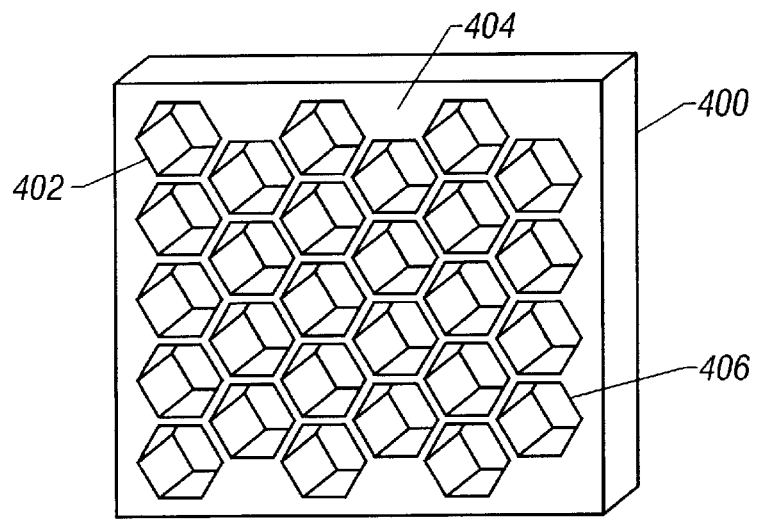
FIG. 4 depicts a perspective view of dielectric-conductor combination material waveguide-below-cutoff EMI-attenuating air ventilation structure 400.

Referring now to FIG. 4, illustrated is a perspective view of dielectric-conductor combination material waveguide-below-cutoff EMI-attenuating air ventilation structure 400. Shown is dielectric-conductor combination material waveguide-below-cutoff EMI-attenuating air ventilation structure 400 formed to have a number of honeycomb-structure apertures, such as honeycomb-structure apertures 402, 404, and 406. As noted in FIG. 4, dielectric-conductor combination material waveguide-below-cutoff EMI-attenuating air ventilation structure 400 can be formed by extruding or molding. In addition, given the relatively low specific hardnesses of most dielectric-conductor combination materials, it is also possible to form dielectric-conductor combination material waveguide-below-cutoff EMI-attenuating air ventilation structure 400 by "punching," or "cutting," the honeycomb-structure apertures from a piece of dielectric-conductor combination material from which dielectric-conductor combination material waveguide-below-cutoff EMI-attenuating air ventilation structure 400 is to be formed. The forgoing is especially true when the dielectric-conductor combination material is conductor-impregnated plastic, such as carbon-impregnated plastic.

Determination of what size apertures to use with the dielectric-conductor combination material waveguide-below-cutoff EMI-attenuating air ventilation structure 400 in order to achieve certain desired EMI attenuation characteristics can be made via the use of the following described empirical process.

First, the generalized equation:

$$\text{Cutoff Frequency in Hertz} = 5.9 \times 10^9 / L$$

where L is the largest dimension of the honeycomb-structure aperture cross section, in inches, and Cutoff Frequency is given in Hertz is used to select an initial value for L. (This equation is taken from H. Ott, *Noise Reduction Techniques in Electronic Systems* 192 (2d ed. 1988)). Using this equation, one selects the cutoff frequency of interest and works backwards to get L. Thereafter, one constructs a dielectric-conductor combination material waveguide-below-cutoff EMI-attenuating air ventilation structure 400, having honeycomb-structure apertures whose largest cross section is L, positions and places the structure proximate to an electromagnetic energy radiating source (e.g., the positioning of the structure proximate to data processing system components, such as described in relation to FIGS. 5 and 7, below).

Subsequent to placement of the structure near the electromagnetic energy radiating source, the electromagnetic waveform energy at a given frequency (typically at or near cutoff) at a given distance from the dielectric-conductor combination material waveguide-below-cutoff EMI-attenuating air ventilation structure 400 is measured. Thereafter, the L values (i.e., size) of the apertures (e.g., honeycomb-structure apertures 402, 404, and 406) are incrementally enlarged, and the electromagnetic waveform energy at the given frequency and distance from dielectric-conductor combination material waveguide-below-cutoff EMI-attenuating air ventilation structure 400 is again measured. If the measured radiation characteristics at the given frequency and distance are still within tolerance, the honeycomb-structure apertures are again enlarged and the measurement of the radiated energy is repeated. This process (enlargement of the apertures and measurement of the radiated energy) is repeated until the measured radiated energy exceeds design tolerance (which will vary with application on a case by case basis depending on the application). When the design tolerance is exceeded, it is known that the size of the honeycomb-structure apertures (e.g., honeycomb-structure apertures 402, 404, and 406) which existed just before the very last incremental enlargement (which took the measurement out of tolerance) is a size which will give a substantially optimum tradeoff between EMI attenuation and air ventilation for dielectric-conductor combination material waveguide-below-cutoff EMI-attenuating air ventilation structure 400. Those skilled in the art will recognize that this empirical approach is in accord with that normally taken in the EMI art.

Figure 5:
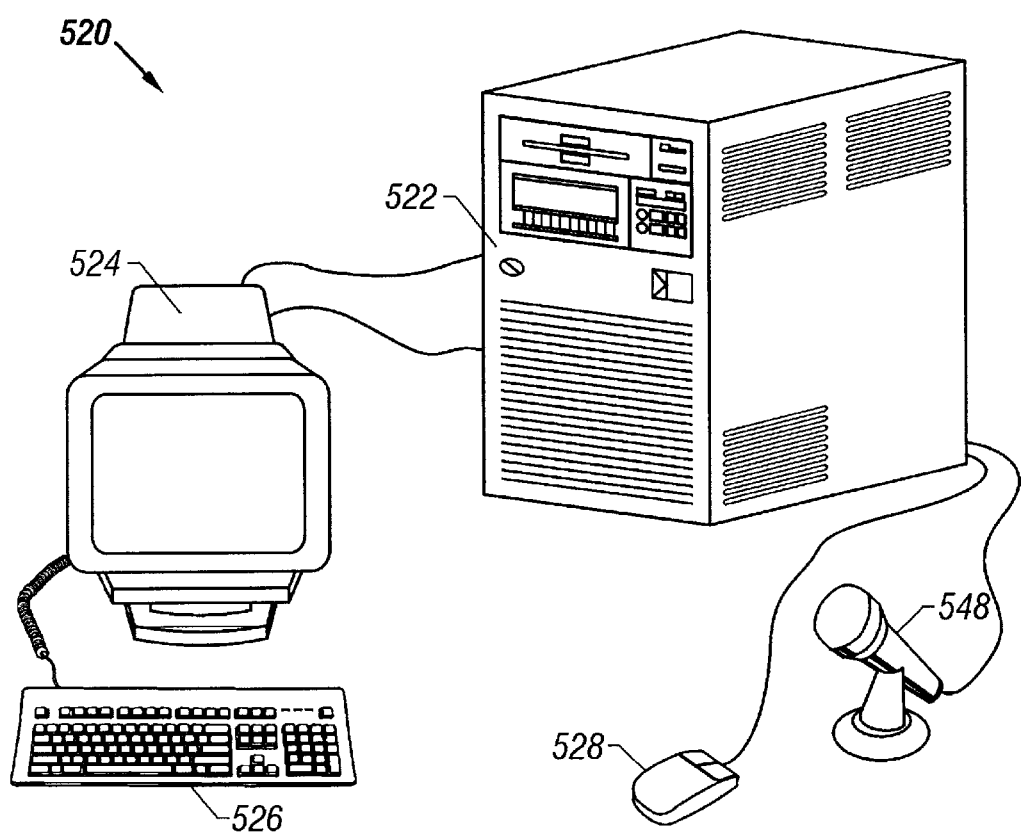
FIG. 5 illustrates a pictorial representation of a conventional data processing system which can be utilized in accordance with the dielectric-conductor combination material waveguide-below-cutoff EMI-attenuating air ventilation structures described herein.

With reference now to FIG. 5, depicted a pictorial representation of a conventional data processing system which can be utilized in accordance with the dielectric-conductor combination material waveguide-below-cutoff EMI-attenuating air ventilation structures described herein. The following is a description of such a system showing use of the present air ventilation structure. A graphical user interface system and method can be implemented with the data processing system depicted in FIG. 5. Data processing system 520 is depicted which includes system unit housing 522, video display device 524, keyboard 526, mouse 528, and microphone 548. Illustrated integral to or with system unit 522 is dielectric-conductor combination material waveguide-below-cutoff EMI-attenuating air ventilation structure 200, which serves to provide ventilation and EMI shielding for data processing system 520. Although only dielectric-conductor combination material waveguide-below-cutoff EMI-attenuating air ventilation structure 200 formed to have a number of circular-structure apertures is shown in FIG. 5, it is to be understood that dielectric-conductor combination material waveguide-below-cutoff EMI-attenuating air ventilation structure 300 formed to have varying-structure apertures and dielectric-conductor combination material waveguide-below-cutoff EMI-attenuating air ventilation structure 400 formed to have honeycomb-structure apertures could also be used to provide ventilation and EMI shielding to data processing system 520. In addition to the foregoing, it is to be understood that the waveguide-below-cutoff EMI-attenuating air ventilation structures could be employed integral to all or part of system unit 522, and exactly how such structures and in which configurations such structures will be deployed is a design choice within the purview of the system designer. For example, an entire printed system unit 522 could be constructed from the waveguide-below-cutoff EMI-attenuating air ventilation structures if such was desired (e.g., the apertures would be present throughout virtually the entire system unit 522). Data processing system 520 may be implemented utilizing any suitable computer such as a DELL Optiplex™ GX1, a product of Dell Computer Corporation, located in Round Rock, Tex.; Optiplex GX1 is a trademark of Dell Computer Corporation.

Figure 6:
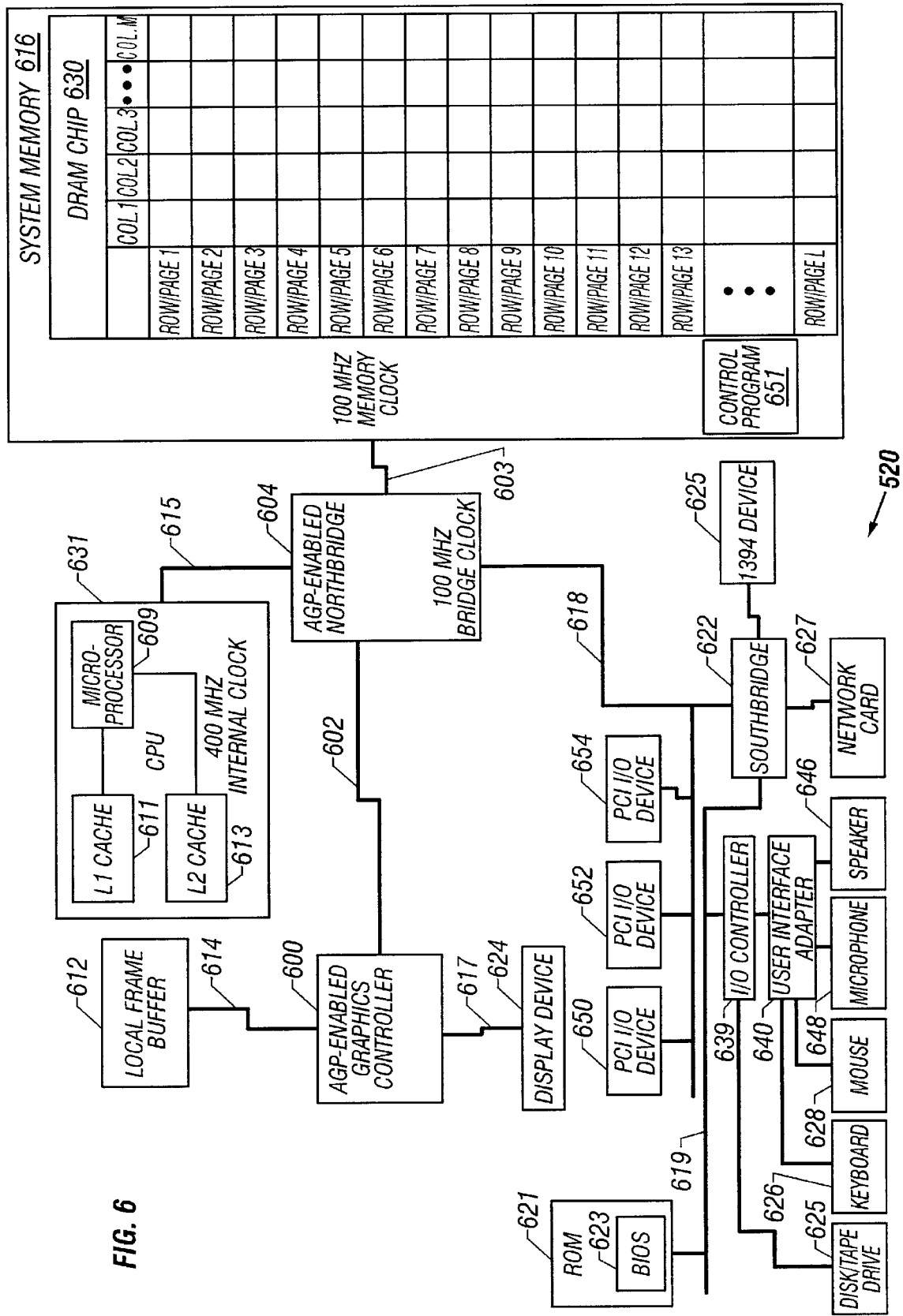
FIG. 6 shows motherboard 650 having selected components in data processing system 520 in which an illustrative embodiment of the dielectric-conductor combination material waveguide-below-cutoff EMI-attenuating air ventilation structures described herein may be implemented.

Referring now to FIG. 6, depicted is motherboard 650 having selected components of data processing system 520 in which an illustrative embodiment of the dielectric-conductor combination material waveguide-below-cutoff EMI-attenuating air ventilation structures described herein may be implemented. Data processing system 520 includes Central Processing Unit ("CPU") 631 (wherein are depicted microprocessor 609, L1 Cache 611, and L2 Cache 613). CPU 631 is coupled to CPU bus 615.

CPU bus 615 is coupled to AGP-enabled Northbridge 604, which serves as a "bridge" between CPU bus 615, AGP interconnect 602 (a type of data bus), and system memory bus 603. In going from one type of bus to another type of bus, a "bridge" is generally needed because the two different type buses speak a different "language." The term "AGP-enabled" is intended to mean that the so-referenced components are engineered such that they interface and function under the standards defined within the AGP interface specification (Intel Corporation, Accelerated Graphics Port Interface Specification).

Generally, each bus in a system utilizes an independent set of protocols (or rules) to conduct data, which are generally set forth in a product specification uniquely tailored to the type of bus in question (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 604, as well as the Southbridge 622, in that it is to be understood that such bridges can translate and coordinate between various data buses and/or devices which communicate through the bridges.

AGP interconnect 602 interfaces with AGP-enabled graphics controller 600, which interconnects with video display device 524 via video display bus 614. AGP-enabled graphics controller 600 also interconnects with video display device 524 via video display bus 617.

AGP-enabled Northbridge 604 interfaces with system memory bus 615. System memory bus 615 interfaces with system memory 616, which can contain various types of memory devices such as DRAM chip 630, but which also can contain synchronous DRAM, Rambus DRAM, other type memory chips. In addition, shown for sake of illustration is that data processing system 520 includes control program 651 which resides within system memory 616 and which is executed and/or operated on by CPU 631. Control program 651 contains instructions that when executed on CPU 631 carries out application program (e.g., video conferencing software) operations.

AGP-enabled Northbridge interfaces with Peripheral Component Interconnect (PCI) bus 618, upon which are shown various PCI Input-Output (I/O) devices 650, 652, and 654. Peripheral Component Interconnect (PCI) bus 618 interfaces with Southbridge 622.

Southbridge 622 serves as a bridge between PCI bus 618 and I/O (or ISA) bus 619, 5394 Device 625, and network card 627. I/O bus 619 interfaces with ROM 621, which for sake of illustration is shown containing system BIOS 623.

I/O bus 619 interfaces with I/O controller 639 for connecting peripheral devices (e.g., disk and tape drives 633) to I/O bus 619. I/O controller 639 interfaces with user interface adapter 640 for connecting keyboard 626, mouse 628, speaker 646, microphone 618, and/or other user interface devices, such as a touch screen device (not shown), to I/O bus 619 through I/O controller 639.

Video display device 624 is the visual output of data processing system 520, which can be a CRT-based video display well-known in the art of computer hardware. However, with a portable or notebook-based computer, video display device 624 can be an LCD-based, or a gas plasma-based, or any other type of flat-panel display.

Any suitable machine-readable media may retain the graphical user interface, such as DRAM 630, ROM 621, a magnetic diskette, magnetic tape, or optical disk (the last three being located in disk and tape drives 633). Any suitable operating system such as one having an associated graphical user interface (e.g., Microsoft Windows) may direct CPU 631. Other technologies can also be utilized in conjunction with CPU 631, such as touch-screen technology or human voice control.

Those skilled in the art will appreciate that the hardware depicted in FIG. 6 may vary for specific applications. For example, other peripheral devices such as optical disk media, audio adapters, video cameras such as those used in videoconferencing, or programmable devices, such as PAL or EPROM programming devices well-known in the art of computer hardware, and the like may be utilized in addition to or in place of the hardware already depicted.

Those skilled in the art will recognize that data processing system 520 can be described in relation to data processing systems which perform essentially the same functions, irrespective of architectures. As an example of such, additional or alternative aspects of data processing system 520 are set forth in FIG. 6.

The foregoing components and devices are used herein as examples for sake of conceptual clarity. Thus, CPU 631 is utilized as an exemplar of any general processing unit, including but not limited to multiprocessor units; CPU bus 615 is utilized as an exemplar of any processing bus, including but not limited to multiprocessor buses; PCI devices 650–654 attached to PCI bus 618 are utilized as exemplars of any input-output devices attached to any I/O bus; AGP Interconnect 602 is utilized as an exemplar of any graphics bus; AGP-enabled graphics controller 600 is utilized as an exemplar of any graphics controller; Northbridge 604 and Southbridge 622 are utilized as exemplars of any type of bridge; 1394 device 625 is utilized as an exemplar of any type of isochronous source; and network card 627, even though the term "network" is used, is intended to serve as an exemplar of any type of synchronous or asynchronous input-output card. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

Figure 7:
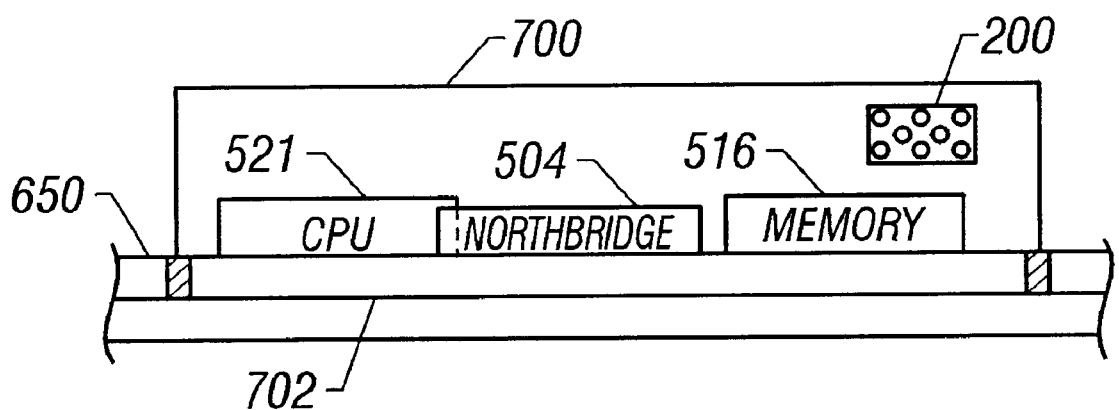
FIG. 7 depicts a portion of motherboard 650 having CPU 631, AGP-enabled Northbridge 604, and system memory 616 wherein is shown an implementation of an illustrative embodiment of the dielectric-conductor combination material waveguide-below-cutoff EMI-attenuating air ventilation structures described herein.

With reference now to FIG. 7, depicted is a portion of motherboard 650 having CPU 631, AGP-enabled Northbridge 604, and system memory 616. Illustrated is a printed circuit board enclosure 700 (which can be constructed from metal or other materials well-known to those within the art) enclosing CPU 631, AGP-enabled Northbridge 604, and system memory 616. Shown is that printed circuit board enclosure 700 electrically connected to ground plane 702 of motherboard 650. Illustrated integral to or with printed circuit board enclosure 700 is dielectric-conductor combination material waveguide-below-cutoff EMI-attenuating air ventilation structure 200, which serves to provide ventilation and EMI shielding for CPU 631, AGP-enabled Northbridge 604, and system memory 616. Although only dielectric-conductor combination material waveguide-below-cutoff EMI-attenuating air ventilation structure 200 formed to have a number of circular-structure apertures is shown in FIG. 5, it is to be understood that dielectric-conductor combination material waveguide-below-cutoff EMI-attenuating air ventilation structure 300 formed to have varying-structure apertures and dielectric-conductor combination material waveguide-below-cutoff EMI-attenuating air ventilation structure 400 formed to have honeycomb-structure apertures could also be used to provide ventilation and EMI shielding to CPU 631, AGP-enabled Northbridge 604, and system memory 616. It is also to be understood that printed circuit board enclosure 700 is merely exemplary of a like structure that can enclose one or more data processing system electrical components. In addition to the foregoing, it is to be understood that the waveguide-below-cutoff EMI-attenuating air ventilation structures could be employed integral to all or part of printed circuit board enclosure 700, and exactly how such structures and in which configurations such structures will be deployed is a design choice within the purview of the system designer. For example, an entire printed circuit board enclosure 700 could be constructed from the waveguide-below-cutoff EMI-attenuating air ventilation structures if such was desired (e.g., the apertures would be present throughout virtually the entire printed circuit board enclosure 700).

The foregoing described embodiments depict different components contained within, or connected with, different other components. It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments have been shown and described, it will be obvious to those skilled in the art that, based upon the teachings herein, changes and modifications may be made without departing from the appended claims and their broader aspects and, therefore, the appended claims are to encompass within their scope all such changes and modifications as are within the true spirit and scope of the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to containing only one such element, even when same claim includes the introductory phrases "one or more" or "at least one" and indefinite articles such as "a" or "an";

the same holds true for the use of definite articles used to introduce claim elements.

What is claimed is:

1. A data processing system comprising:
   an enclosure of the data processing system having a waveguide-below-cutoff EMI-attenuating air ventilation structure formed from a dielectric-conductor combination material; and
   said enclosure of the data processing system containing at least one data processing system component selected from the group comprising a processor, a memory, a bridge, a bus, a graphics processor, a network card, an isochronous device.

2. The data processing system of claim 1, wherein the waveguide-below-cutoff EMI-attenuating air ventilation structure formed from a dielectric-conductor combination material further includes:
   the waveguide-below-cutoff EMI-attenuating air ventilation structure having at least one circular-structure aperture.

3. The data processing system of claim 1, wherein the waveguide-below-cutoff EMI-attenuating air ventilation structure formed from a dielectric-conductor combination material further includes:
   the waveguide-below-cutoff EMI-attenuating air ventilation structure having at least one varying-structure aperture.

4. The data processing system of claim 1, wherein the waveguide-below-cutoff EMI-attenuating air ventilation structure formed from a dielectric-conductor combination material further includes:
   the waveguide-below-cutoff EMI-attenuating air ventilation structure having at least one honeycomb-structure aperture.

5. The data processing system of claim 1, wherein the waveguide-below-cutoff EMI-attenuating air ventilation structure formed from a dielectric-conductor combination material further includes:
   the waveguide-below-cutoff EMI-attenuating air ventilation structure formed from conductive elastomeric material.

6. The data processing system of claim 1, wherein the waveguide-below-cutoff EMI-attenuating air ventilation structure formed from a dielectric-conductor combination material further includes:
   the waveguide-below-cutoff EMI-attenuating air ventilation structure formed from conductor-impregnated plastic.

7. The data processing system of claim 1, wherein said enclosure of the data processing system having a waveguide-below-cutoff EMI-attenuating air ventilation structure formed from a dielectric-conductor combination material further comprises:
   the waveguide-below-cutoff EMI-attenuating air ventilation structure integral with a data processing system unit housing.

8. The data processing system of claim 1, wherein said enclosure of the data processing system having a waveguide-below-cutoff EMI-attenuating air ventilation structure formed from a dielectric-conductor combination material further comprises:
   the waveguide-below-cutoff EMI-attenuating air ventilation structure integral with a printed circuit board enclosure.

9. A shielding structure comprising:
   a waveguide-below-cutoff EMI-attenuating air ventilation structure formed from a dielectric-conductor combination material.

10. The shielding structure of claim 9, wherein said waveguide-below-cutoff EMI-attenuating air ventilation structure formed from a dielectric-conductor combination material further includes:
    the waveguide-below-cutoff EMI-attenuating air ventilation structure having at least one circular-structure aperture.

11. The shielding structure of claim 9, wherein said waveguide-below-cutoff EMI-attenuating air ventilation structure formed from a dielectric-conductor combination material further includes:
    the waveguide-below-cutoff EMI-attenuating air ventilation structure having at least one varying-structure aperture.

12. The shielding structure of claim 9, wherein said waveguide-below-cutoff EMI-attenuating air ventilation structure formed from a dielectric-conductor combination material further includes:
    the waveguide-below-cutoff EMI-attenuating air ventilation structure having at least one honeycomb-structure aperture.

13. The shielding structure of claim 9, wherein said waveguide-below-cutoff EMI-attenuating air ventilation structure formed from a dielectric-conductor combination material further includes:
    the waveguide-below-cutoff EMI-attenuating air ventilation structure formed from conductive elastomeric material.

14. The shielding structure of claim 9, wherein said waveguide-below-cutoff EMI-attenuating air ventilation structure formed from a dielectric-conductor combination material further includes:
    the waveguide-below-cutoff EMI-attenuating air ventilation structure formed from conductor-impregnated plastic.

15. A method for manufacturing a waveguide-below-cutoff EMI-attenuating air ventilation structure comprising:
    forming at least one aperture structured to attenuate at least one specified electromagnetic energy waveform within a dielectric-conductor combination material.

16. The method of claim 15, wherein said forming at least one aperture structured to attenuate at least one specified electromagnetic energy waveform within a dielectric-conductor combination material further includes:
    forming at least one circular-structure aperture.

17. The method of claim 15, wherein said forming at least one aperture structured to attenuate at least one specified electromagnetic energy waveform within a dielectric-conductor combination material further includes:
    forming at least one varying-structure aperture.

18. The method of claim 15, wherein said forming at least one aperture structured to attenuate at least one specified electromagnetic energy waveform within a dielectric-conductor combination material further includes:
    forming at least one honeycomb-structure aperture.

19. The method of claim 15, wherein said forming at least one aperture structured to attenuate at least one specified electromagnetic energy waveform within a dielectric-conductor combination material further includes:
    forming at least one aperture structured to attenuate at least one specified electromagnetic energy waveform within a conductive elastomeric material.

20. The method of claim 15, wherein said forming at least one aperture structured to attenuate at least one specified electromagnetic energy waveform within a dielectric-conductor combination material further includes:
    forming at least one aperture structured to attenuate at least one specified electromagnetic energy waveform within a conductor-impregnated plastic material.

21. The method of claim 15, wherein said forming at least one aperture structured to attenuate at least one specified electromagnetic energy waveform within a dielectric-conductor combination material further includes:

forming at least one aperture structured to attenuate at least one specified electromagnetic energy waveform by molding.

22. The method of claim 15, wherein said forming at least one aperture structured to attenuate at least one specified electromagnetic energy waveform within a dielectric-conductor combination material further includes:

forming at least one aperture structured to attenuate at least one specified electromagnetic energy waveform by cutting.

23. The method of claim 15, wherein said forming at least one aperture structured to attenuate at least one specified electromagnetic energy waveform within a dielectric-conductor combination material further includes:

forming at least one aperture structured to attenuate at least one specified electromagnetic energy waveform by extruding.

* * * * *